(12) United States Patent
Kiani

(10) Patent No.: US 7,397,296 B1
(45) Date of Patent: Jul. 8, 2008

(54) POWER SUPPLY DETECTION CIRCUIT BIASED BY MULTIPLE POWER SUPPLY VOLTAGES FOR CONTROLLING A SIGNAL DRIVER CIRCUIT

(75) Inventor: Khusrow Kiani, Oakland, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 34 days.

(21) Appl. No.: 11/609,690

(22) Filed: Dec. 12, 2006

(51) Int. Cl.
*H03L 5/00* (2006.01)

(52) U.S. Cl. .......................................... 327/333; 326/81

(58) Field of Classification Search .................. 326/80, 326/81; 327/318, 319, 321, 333
See application file for complete search history.

(56) References Cited

U.S. PATENT DOCUMENTS 6,163,170 A * 12/2000 Takinomi ..................... 326/81
6,566,930 B1 * 5/2003 Sato ............................ 327/333

* cited by examiner

*Primary Examiner*—Jeffrey S Zweizig
(74) *Attorney, Agent, or Firm*—Vedder Price P.C.

(57) ABSTRACT

A power supply detection circuit biased by at least two power supply voltages for controlling a signal driver circuit. Upstream and downstream amplifiers, powered by upstream and downstream power supply voltages, respectively, process an original control signal to produce a differential signal via output signal electrodes. Capacitances coupling respective ones of the output signal electrodes to the downstream power supply voltage and the circuit reference potential discharge and charge respective ones of the output signal electrodes in relation to initial receptions of the upstream and downstream power supply voltages and original control signal, following which voltage clamp circuitry maintains such discharged and charged states pending reception of the original control signal in a predetermined state.

14 Claims, 2 Drawing Sheets

POWER SUPPLY DETECTION CIRCUIT BIASED BY MULTIPLE POWER SUPPLY VOLTAGES FOR CONTROLLING A SIGNAL DRIVER CIRCUIT

BACKGROUND OF THE INVENTION

1. Field of the Invention

The present invention relates to interface circuits for translating voltage levels of signals between circuits biased by unequal power supply voltages, and in particular, to such interface circuits with minimum power consumption during initial application of the power supply voltages.

2. Related Art

Referring to FIG. 1, a power supply detection circuit has become an essential part of the input/output (I/O) interface in digital and mixed signal integrated circuits, or "chips", having multiple, e.g., two, power supplies. For example, a typical example of such a chip 10 includes, at a minimum, core circuitry 12 biased by a core power supply voltage VDD, and I/O interface circuitry 14 powered by another power supply voltage VDDIO. Typically, the core circuit 12 operates at a lower power supply voltage to minimize power consumption, while the I/O circuit 14 operates, at least in part, at a higher power supply voltage so as to provide appropriate signal levels to and receive higher level signals from circuitry outside the chip 10 which often operates at such higher power supply voltage. Additionally, the core circuit 12 is often primarily, if not exclusively, digital circuitry using insulated gate field effect transistors (IGFETs, often still referred to as metal oxide semiconductor field effect transistors, or MOSFETs) having thin gate oxides, while the I/O circuit 14 uses transistors having thicker gate oxides. Accordingly, the core power supply voltage VDD is less than the I/O power supply voltage VDDIO.

Depending upon the functions to be performed by the chip 10, various signals 15 are conveyed between the core 12 and I/O 14 circuits. Some signals 15a may flow exclusively from the core 12 to the I/O 14 circuit while other signals 15b may flow exclusively in the opposite direction. Additionally, some signals 15c may be bi-directional between the circuits 12, 14. Similarly, the I/O circuit 14 provides outgoing signals 11a and receives incoming signals 11b, and may also exchange bi-directional signals 11c.

During initial application of the power supply voltages VDD, VDDIO, a power supply detection circuit monitors the actual reception of the voltages. In many instances, the I/O power supply voltage VDDIO is applied, or asserted, prior to application of the core power supply voltage VDD. This is done to establish the appropriate interfaces between the I/O circuit 14 and the core circuit 12. Moreover, there should be virtually no current consumption by the I/O driver output circuit. During this interval, however, the output interfaces, i.e., those electrodes responsible for providing communication between the chip 10 and other external circuits (not shown) must remain disabled. This is often problematic since the output enable signal is typically generated by the core circuit 12 which is powered by the core power supply voltage VDD, which has not yet been applied.

Accordingly, it is desirable to provide circuitry for detecting the core power supply voltage VDD while still disabling the output interfaces within the I/O circuit 14. More importantly, it would be desirable to provide this capability while consuming minimal, if any, power, consistent with the goals of low power consumption achieved during normal circuit operation due to the lower core power supply voltage VDD.

SUMMARY OF THE INVENTION

In accordance with the presently claimed invention, a power supply detection circuit biased by at least two power supply voltages for controlling a signal driver circuit is provided. Upstream and downstream amplifiers, powered by upstream and downstream power supply voltages, respectively, process an original control signal to produce a differential signal via output signal electrodes. Capacitances coupling respective ones of the output signal electrodes to the downstream power supply voltage and the circuit reference potential discharge and charge respective ones of the output signal electrodes in relation to initial receptions of the upstream and downstream power supply voltages and original control signal, following which voltage clamp circuitry maintains such discharged and charged states pending reception of the original control signal in a predetermined state.

In accordance with one embodiment of the presently claimed invention, a power supply detection circuit biased by at least two power supply voltages for controlling a signal driver circuit includes: a circuit reference electrode; a first power supply electrode to convey a first power supply voltage; a second power supply electrode to convey a second power supply voltage; first amplifier circuitry coupled between said circuit reference and first power supply electrodes, and responsive to said first power supply voltage and a first signal having at least asserted and de-asserted signal states by providing a second signal having corresponding signal states; second amplifier circuitry including first and second output signal electrodes, coupled between said circuit reference and second power supply electrodes and to said first amplifier circuitry, and responsive to said second power supply voltage and said second signal by providing, via said first and second output signal electrodes, a differential signal having asserted and de-asserted signal states corresponding to said first asserted and de-asserted signal states; a first capacitance coupled between said circuit reference electrode and said first output signal electrode; a second capacitance coupled between said second power supply electrode and said second output signal electrode; and voltage clamp circuitry coupled to said circuit reference electrode and said first and second output signal electrodes, and responsive to at least a portion of said differential signal by selectively clamping said first output signal electrode at one of a plurality of voltages in relation to said differential signal states.

In accordance with another embodiment of the presently claimed invention, a power supply detection circuit biased by at least two power supply voltages for controlling a signal driver circuit includes: circuit reference means for providing a circuit reference voltage; first power supply means for providing a first power supply voltage; second power supply means for providing a second power supply voltage; first amplifier means for receiving and responding to said circuit reference and first power supply voltages and a first signal having at least asserted and de-asserted signal states by providing a second signal having corresponding signal states; second amplifier means for receiving and responding to said circuit reference and second power supply voltages and said second signal by providing, via first and second output signal electrodes, a differential signal having asserted and de-asserted signal states corresponding to said first asserted and de-asserted signal states; first capacitive means for capacitively coupling said circuit reference voltage to said first output signal electrode; second capacitive means for capacitively coupling said second power supply voltage to said second output signal electrode; and voltage clamping means for receiving and responding to said circuit reference voltage and at least a portion of said differential signal by selectively clamping said first output signal electrode at one of a plurality of voltages in relation to said differential signal states.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1:
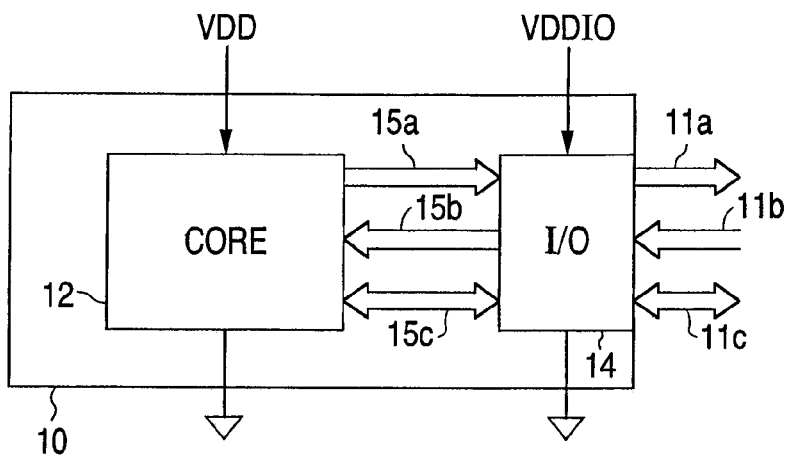
FIG. 1 is a simplified block diagram of a conventional integrated circuit powered by two power supply voltages.
Figure 2:
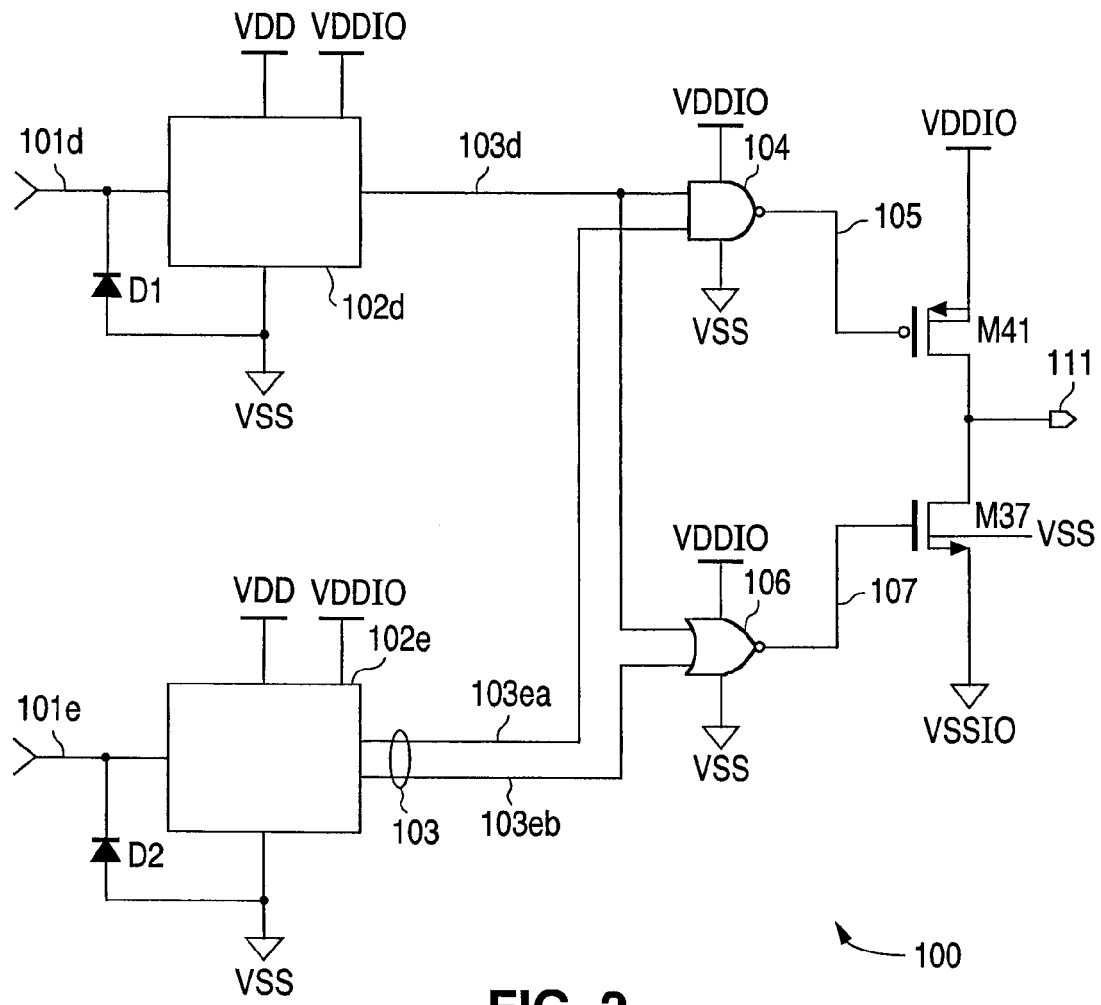
FIG. 2 is a block diagram of control circuitry used for disabling a signal interface in response to a control signal generated by a power supply detection circuit in accordance with one embodiment of the presently claimed invention.

Referring to FIG. 2, an I/O cell circuit 100 for enabling and disabling an I/O signal pad 111 that conveys a data signal includes level shifting circuits 102d, 102e, a NAND gate 104, a NOR gate 106, and output transistors M41 (P-type) and M37 (N-type) for pulling up and pulling down, respectively, the output signal pad 111 according to the assertion and de-assertion states of the data signal 101d. The outgoing data signal 101d is level-shifted by its level shifting circuitry 102d to produce data signal 103d. Similarly, the output enable control signal 101e is level-shifted by its level shifting circuitry 102e to produce a differential enable control signal 103 having positive 103ea and negative 103eb signal phases. Clamping diodes D1, D2 serve as "antenna" diodes for discharging the input nodes during the fabrication process.

During normal operation, both power supplies VDD, VDDIO are asserted. When the output is to be disabled, the enable control signal 101e is de-asserted, or low. This causes the differential signal 103 to be in its de-asserted state with its positive phase 103ea low and its negative phase 103eb high. These signal states disable the NAND 104 and NOR 106 gates, thereby causing the NAND output signal 105 to be high and the NOR output signal 107 to be low. This, in turn, causes both of the output driver transistors M41, M37 to be turned off, thereby disabling the output signal pad 111. Accordingly, with both output transistors M41, M37 turned off, no current flows from the power supply VDDIO to the circuit reference VSS.

When the output signal pad 111 is to be enabled for driving a signal in conformance with the data signal 101d, the enable control signal 101e will be asserted, or high. This causes the differential signal 103 to become asserted, with its positive phase 103ea high and its negative phase 103eb low. These signal states enable the NAND 104 and NOR 106 gates such that their respective output signals 105, 107 form differential signal phases corresponding to the level-shifted data signal 103d. This, in turn, causes the signal at the output signal pad 111 to switch according to the level-shifted data signal 103d.

As noted, this is the normal mode of operation, i.e., following the initial power up interval when DC power is first applied. However, since the two power supplies VDD, VDDIO are typically supplied through different voltage regulators, there is generally a time delay for the core power supply voltage VDD to be asserted after the I/O power supply voltage VDDIO has been asserted. This causes the states of various signals of the level shifter, both internal and external, to be unknown, since without its power supply voltage VDD many of its internal nodes (discussed in more detail below for FIG. 3) will be at indeterminate or improper voltage levels. Hence, although the intent is to have the output driver disabled during the power up interval, it cannot be guaranteed that the internal nodes of the level shifter 102e will be in the proper states to provide the output signal phases 103ea, 103eb in the states necessary to keep the NAND output signal 105 high and the NOR output signal 107 low.

Figure 3:
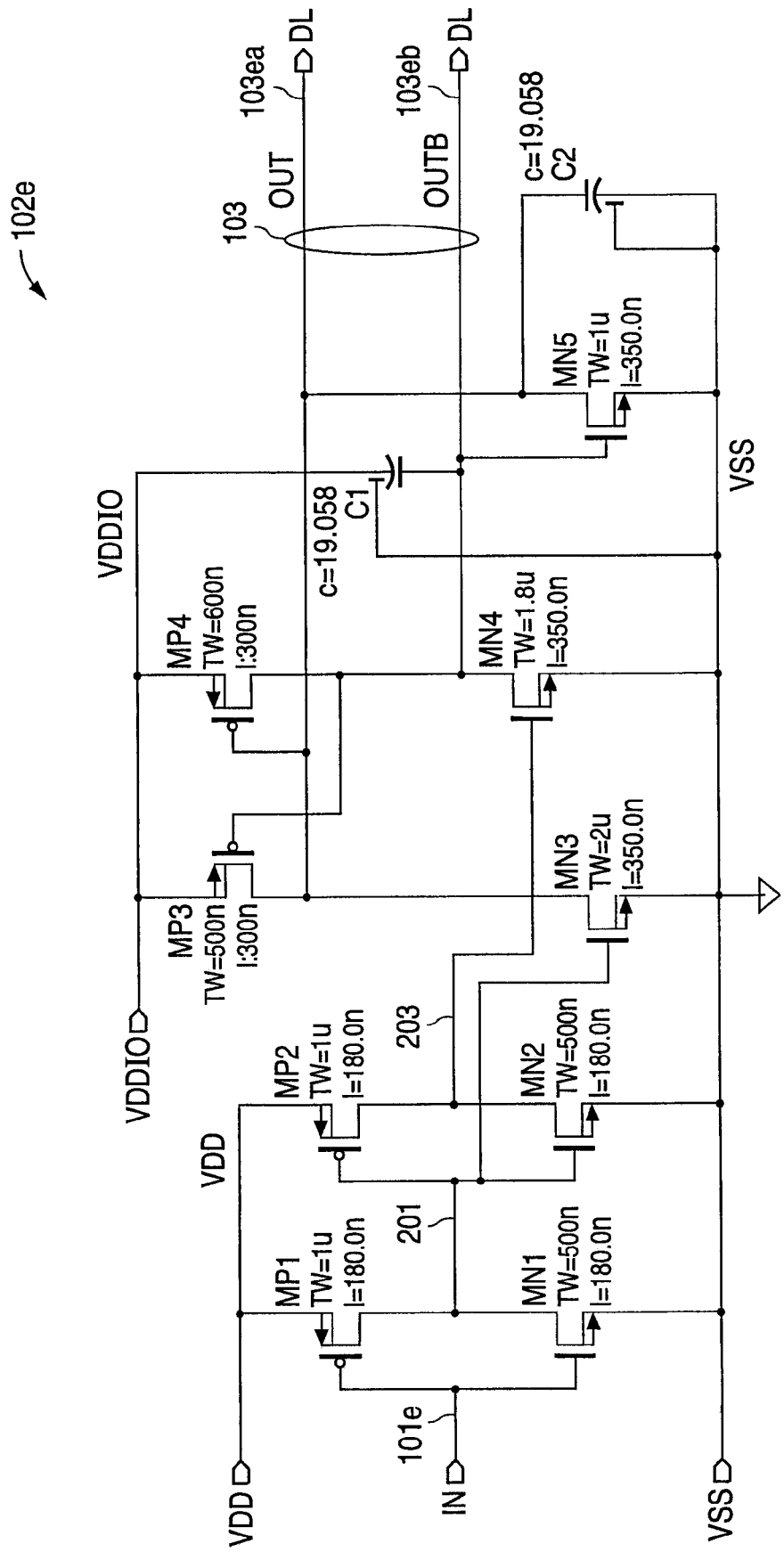
FIG. 3 is a schematic diagram of a power supply detection circuit in accordance with one embodiment of the presently claimed invention.

Referring to FIG. 3, a power supply detection circuit in accordance with one embodiment of the presently claimed invention includes a level shifter circuit 102e with relative sizing of the transistor channels driving the output signal phases 103ea, 103eb, such that the negative signal phase 103eb is favored, plus additional components in the forms of accumulation capacitors C1, C2 and a voltage clamp in the form of a pull down transistor MN5.

The enable control signal 101e is inverted by an input inverter circuit implemented with complementary transistors MP1, MN1, with the resulting signal 201 further inverted by another inverter circuit, also implemented with complementary transistors MP2, MN2. Both inverter circuits are powered by the core power supply voltage VDD. The input 201 and output 203 signals of this second inverter circuit MP2, MN2 form a differential signal driving a differential output amplifier circuit implemented with two cross-coupled circuit branches containing complementary transistors MP3, MN3, MP4, MN4. This differential amplifier circuit is powered by the I/O power supply voltage VDDIO, and produces the differential output signal 103.

An accumulation capacitor C1 capacitively couples the electrode for the power supply voltage VDDIO to the electrode for the negative output signal phase 103eb. Similarly, another accumulation capacitor C2 capacitively couples the electrode for the circuit reference potential VSS to the electrode for the positive output signal phase 103ea. Transistor MN5 provides voltage clamping at the electrode for the positive output signal phase 103ea in response to the voltage at the electrode for the negative output signal phase 103eb, which drives its gate electrode.

Operation of this level shifting circuit 102e occurs in two phases. The first phase is during the initial application of power, during which the I/O power supply VDDIO is active but the core power supply voltage VDD is not yet active. This makes the output amplifier MP3, MN3, MP4, MN4 active, while the input amplifiers MP1, MN1, MP2, MN2 are not yet active, thereby causing the inverted signals 201, 203 to have indeterminate signal states. The initial application of the I/O power supply voltage VDDIO causes transient current to flow through coupling capacitor C1, thereby charging the gate electrode of the voltage clamp transistor MN5. Similarly, coupling capacitor C2 discharges the drain electrode of transistor MN5. Collectively, these actions cause transistor MN5 to turn on, thereby actively pulling down the electrode for the positive output signal phase 103ea, i.e., clamping its voltage down at approximately the circuit reference potential VSS. As a result, the differential output signal 103 is in its de-asserted state, with its positive 103ea and negative 103eb output signal phases in their low and high states, respectively. Hence, as discussed above, the output signal pad 111 is disabled with both output driver transistors M41, M37 turned off (FIG. 2).

Subsequently, during power up, immediately following the initial ramping of the I/O power supply voltage VDDIO and until the time that the core power supply voltage VDD is asserted, the charges that are accumulated from the parasitic body diodes of transistor MP3, (0.5 um channel pulling up the positive output signal phase 103ea) and transistors MN3 and MN5 (2 um and 1 um channels together pulling down the positive output signal phase 103ea), as compared to the charges that are accumulated from the parasitic body diodes of MP4 (0.6 um pulling up the negative output signal phase 103eb) and transistor MN4 (1.8 um pulling down the negative output signal phase 103eb), results in more leakage to the circuit reference VSS for the node providing the positive output signal phase 103ea than for the node providing the negative output signal phase 103eb. Hence, the initial states of the positive 103ea and negative 103eb output signal phases as established by transistor MN5 remain intact. Accordingly, the driver transistors M41, M37 for the output signal pad 111 remain disabled.

Based upon the foregoing, it can be seen that a power supply detection circuit in accordance with the presently claimed invention advantageously disables the output signal driver during and following initial application of the power supply voltages in such a manner as to minimize power consumption, and even virtually eliminate power consumption for the output driver circuit itself. Particularly when many I/O signal pads are used, such as on a typical integrated circuit having a high pin count, the resulting power savings can be considerable.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a power supply detection circuit biased by at least two power supply voltages for controlling a signal driver circuit, comprising:
    a circuit reference electrode;
    a first power supply electrode to convey a first power supply voltage;
    a second power supply electrode to convey a second power supply voltage;
    first amplifier circuitry coupled between said circuit reference and first power supply electrodes, and responsive to said first power supply voltage and a first signal having at least asserted and de-asserted signal states by providing a second signal having corresponding signal states;
    second amplifier circuitry including first and second output signal electrodes, coupled between said circuit reference and second power supply electrodes and to said first amplifier circuitry, and responsive to said second power supply voltage and said second signal by providing, via said first and second output signal electrodes, a differential signal having asserted and de-asserted signal states corresponding to said first asserted and de-asserted signal states;
    a first capacitance coupled between said circuit reference electrode and said first output signal electrode;
    a second capacitance coupled between said second power supply electrode and said second output signal electrode; and
    voltage clamp circuitry coupled to said circuit reference electrode and said first and second output signal electrodes, and responsive to at least a portion of said differential signal by selectively clamping said first output signal electrode at one of a plurality of voltages in relation to said differential signal states.

2. The apparatus of claim 1, wherein said second power supply voltage is greater than said first power supply voltage.

3. The apparatus of claim 1, wherein, responsive to reception of said second power supply voltage and prior to reception of said first power supply voltage, said first capacitance discharges said first output signal electrode and said second capacitance charges said second output signal electrode such that said differential signal attains said de-asserted signal state.

4. The apparatus of claim 3, wherein, following reception of said first power supply voltage following said reception of said second power supply voltage and while awaiting reception of said first signal with said asserted signal state, said voltage clamp circuitry is responsive to said differential signal by maintaining said differential signal in said de-asserted signal state.

5. The apparatus of claim 3, wherein, following reception of said first power supply voltage following said reception of said second power supply voltage and while awaiting reception of said first signal with said asserted signal state, said voltage clamp circuitry is responsive to said differential signal by maintaining said discharge of said first output signal electrode.

6. The apparatus of claim 1, wherein said first amplifier circuitry comprises a plurality of inverter circuits.

7. The apparatus of claim 1, wherein said first amplifier circuitry comprises a plurality of serially coupled inverter circuits.

8. The apparatus of claim 1, wherein said second amplifier circuitry comprises a cross-coupled differential amplifier circuit.

9. The apparatus of claim 1, wherein said voltage clamp circuitry comprises a field effect transistor with gate, drain and source electrodes coupled to said second output signal, first output signal and reference electrodes, respectively.

10. An apparatus including a power supply detection circuit biased by at least two power supply voltages for controlling a signal driver circuit, comprising:
    circuit reference means for providing a circuit reference voltage;
    first power supply means for providing a first power supply voltage;

second power supply means for providing a second power supply voltage;

first amplifier means for receiving and responding to said circuit reference and first power supply voltages and a first signal having at least asserted and de-asserted signal states by providing a second signal having corresponding signal states;

second amplifier means for receiving and responding to said circuit reference and second power supply voltages and said second signal by providing, via first and second output signal electrodes, a differential signal having asserted and de-asserted signal states corresponding to said first asserted and de-asserted signal states;

first capacitive means for capacitively coupling said circuit reference voltage to said first output signal electrode;

second capacitive means for capacitively coupling said second power supply voltage to said second output signal electrode; and voltage clamping means for receiving and responding to said circuit reference voltage and at least a portion of said differential signal by selectively clamping said first output signal electrode at one of a plurality of voltages in relation to said differential signal states.

11. The apparatus of claim 10, wherein said second power supply voltage is greater than said first power supply voltage.

12. The apparatus of claim 10, wherein, in response to reception of said second power supply voltage and prior to reception of said first power supply voltage, said first capacitive means is for discharging said first output signal electrode and said second capacitive means is for charging said second output signal electrode such that said differential signal attains said de-asserted signal state.

13. The apparatus of claim 12, wherein, following reception of said first power supply voltage following said reception of said second power supply voltage and while awaiting reception of said first signal with said asserted signal state, said voltage clamping means is for responding to said differential signal by maintaining said differential signal in said de-asserted signal state.

14. The apparatus of claim 12, wherein, following reception of said first power supply voltage following said reception of said second power supply voltage and while awaiting reception of said first signal with said asserted signal state, said voltage clamping means is for responding to said differential signal by maintaining said discharge of said first output signal electrode.

* * * * *